(12) United States Patent
Harada et al.

(10) Patent No.: US 9,094,037 B2
(45) Date of Patent: Jul. 28, 2015

(54) SEMICONDUCTOR DEVICE

(75) Inventors: Daijiro Harada, Kanagawa (JP);
Takashi Utsumi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 336 days.

(21) Appl. No.: 13/331,923

(22) Filed: Dec. 20, 2011

(65) Prior Publication Data

US 2012/0159020 A1 Jun. 21, 2012

(30) Foreign Application Priority Data

Dec. 21, 2010 (JP) .................................. 2010-284393

(51) Int. Cl.
*G06F 3/00* (2006.01)
*H03M 1/12* (2006.01)

(52) U.S. Cl.
CPC ...................................... *H03M 1/12* (2013.01)

(58) Field of Classification Search
CPC ............. G06F 3/05; G06F 13/00; G06F 1/06; G06F 1/3228; H03M 1/12; H03M 1/1225
USPC .......................................................... 710/69
See application file for complete search history.

(56) References Cited

U.S. PATENT DOCUMENTS

| 5,212,483 | A | * | 5/1993 | Wakimoto ..................... 341/141 |
| 5,760,721 | A | | 6/1998 | Inoue et al. |
| 6,507,298 | B1 | * | 1/2003 | Barrenscheen et al. ....... 341/141 |
| 6,701,395 | B1 | * | 3/2004 | Byrne et al. ..................... 710/69 |
| 7,046,184 | B2 | * | 5/2006 | Kumakura ..................... 341/155 |
| 7,557,745 | B2 | * | 7/2009 | Oak ............................... 341/155 |
| 2004/0267986 | A1 | * | 12/2004 | Leung et al. .................... 710/69 |
| 2010/0245141 | A1 | * | 9/2010 | Ushie ............................ 341/122 |

FOREIGN PATENT DOCUMENTS

| JP | 56-118139 A | 9/1981 |
| JP | 08-265156 A | 10/1996 |
| JP | 09-297658 A | 11/1997 |
| JP | 2002-342266 A | 11/2002 |
| JP | 2010-041152 A | 2/2010 |
| JP | 2010-146258 A | 7/2010 |

OTHER PUBLICATIONS

Japanese Office Action dated Apr. 1, 2014 issued in corresponding Japanese Patent Application No. 2010-284393.

* cited by examiner

*Primary Examiner* — Idriss N Alrobaye
*Assistant Examiner* — Brooke Taylor
(74) *Attorney, Agent, or Firm* — Sughrue Mion, PLLC (57) ABSTRACT

There is a need to cause a delay to occur less frequently than the related art during processing of an input signal in need of relatively fast processing. In a semiconductor device, a conversion portion includes first channels and second channels and A/D converts a signal input to a selected channel. A signal input to the first channel requires faster processing than a signal input to the second channel. The conversion portion receives a scan conversion instruction from a central processing unit, sequentially selects the input channels in a specified selection order, and successively performs A/D conversion. In this case, the conversion portion notifies a peripheral circuit of completion of A/D conversion after completion of A/D conversion on signals input to the first channels and before completion of A/D conversion on input signals input to all input channels.

11 Claims, 8 Drawing Sheets

FIG. 6

SEMICONDUCTOR DEVICE

CROSS-REFERENCE TO RELATED APPLICATIONS

The disclosure of Japanese Patent Application No. 2010-284393 filed on Dec. 21, 2010 including the specification, drawings and abstract is incorporated herein by reference in its entirety.

BACKGROUND

The present invention relates to a semiconductor device having an analog-digital converter.

An A/D converter performs analog-to-digital conversion on an analog signal input from plural channels by switching the channels. In many cases, the A/D converter is supplied with a mix of a signal requiring high-speed processing and a signal requiring low-speed processing. In such a case, a processing delay might occur, that is, the A/D conversion might be uncompleted for a signal requiring high-speed processing by the specified time.

For example, Japanese Unexamined Patent Publication No. 2010-41152 (patent document 1) discloses the technology of decreasing processing delays. According to the technology described in this document, an A/D converter is set to start for a channel and then an asynchronous A/D conversion request might occur for a channel different from the already set channel before the A/D converter starts for that channel. In such a case, the A/D converter is reset to start so that the A/D conversion will start after a lapse of specified time in consideration of the time to perform the A/D conversion on plural channels that requested the A/D conversion.

Patent Document 1: Japanese Unexamined Patent Publication No. 2010-41152

SUMMARY

Generally, an A/D converter having plural input channels provides a scan conversion mode that successively selects the input channels and continuously A/D converts input signals to all the channels. In this case, a register temporarily stores A/D conversion results of all the channels. After a sequence of A/D conversion is completed, a CPU (central processing unit) is interrupted to read data stored in the register.

According to this method, however, data after the A/D conversion cannot be processed until the A/D conversion is completed for all the channels. A processing delay might occur for signals requiring high-speed processing.

The present invention has been made in consideration of the foregoing. It is therefore an object of the invention to cause a delay to occur less frequently than the related art during processing of an input signal in need of relatively fast processing on a semiconductor device having an A/D converter that scans and converts signals input to plural channels.

A semiconductor device according to an embodiment of the invention includes: a central processing unit; plural peripheral circuits including first and second peripheral circuits; and a conversion portion. The conversion portion has plural input channels including one or more first channels and one or more second channels, selects one of the input channels, and A/D converts a signal input to a selected input channel. Signal processing in the first peripheral circuit uses an A/D conversion result on a signal input to the one or more first channels. Signal processing in the second peripheral circuit uses an A/D conversion result on a signal input to the one or more second channels. A signal input to the one or more first channels requires faster processing than a signal input to the one or more second channels. The conversion portion receives a scan conversion instruction from the central processing unit or the peripheral circuits, sequentially selects the input channels in accordance with a specified selection order, and successively performs A/D conversion. The conversion portion receives the scan conversion instruction, notifies the first peripheral circuit of completion of A/D conversion after completion of A/D conversion on a signal input to the one or more first channels and before completion of A/D conversion on input signals input to all input channels, and notifies the second peripheral circuit of completion of A/D conversion after completion of A/D conversion on input signals input to all input channels.

The above-mentioned embodiment can cause a delay to occur less frequently than the related art during processing of an input signal that is input to one or more first channels and requires relatively fast processing.

DETAILED DESCRIPTION

Embodiments of the present invention will be described in further detail with reference to the accompanying drawings. The mutually corresponding parts or equivalents in the embodiments are designated by the same reference numerals and a description is omitted for simplicity.

First Embodiment

Figure 1:
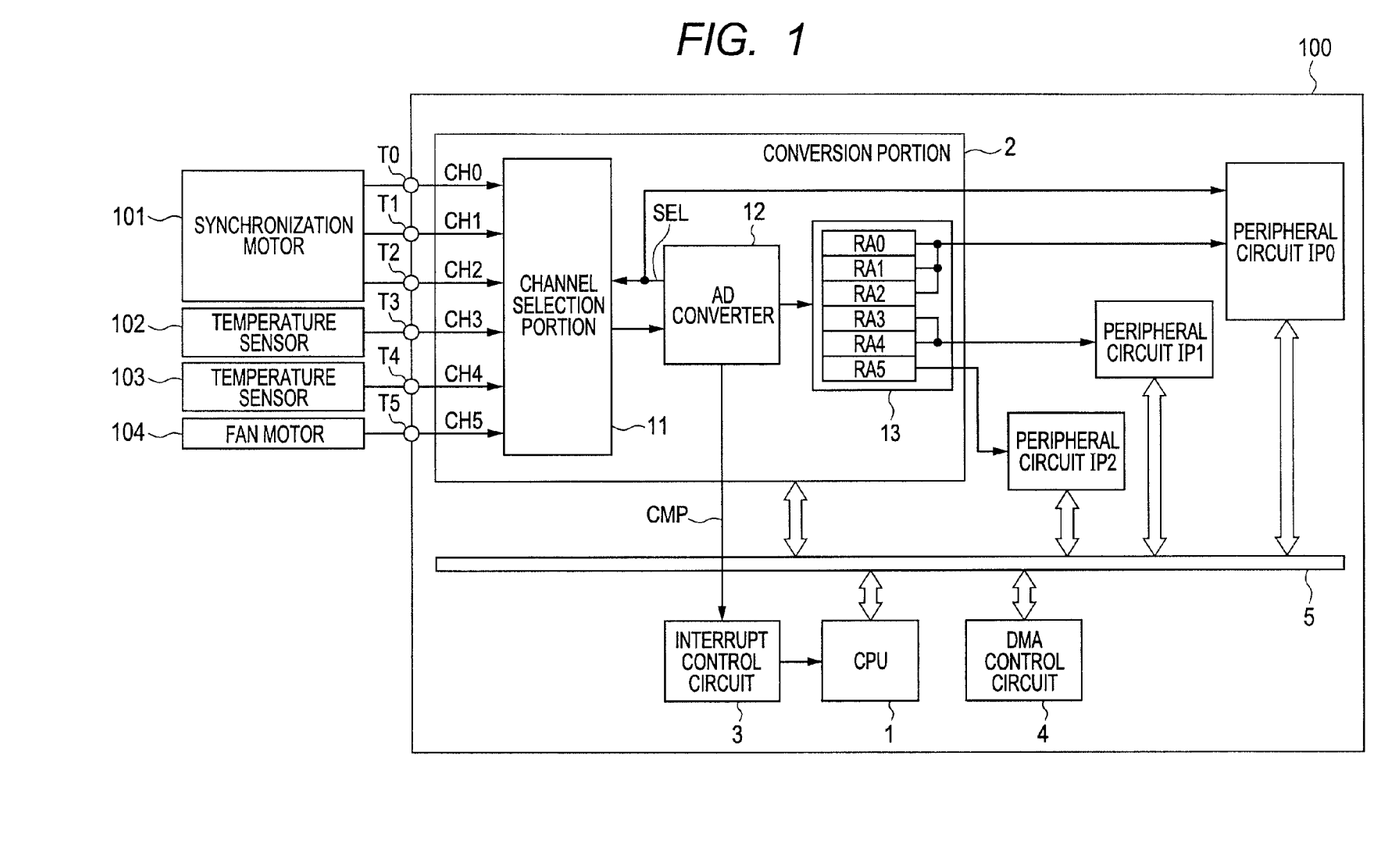
FIG. 1 is a block diagram showing a configuration of a microcontroller 100 according to a first embodiment of the invention.

FIG. 1 is a block diagram showing a configuration of a microcontroller 100 according to a first embodiment of the invention.

FIG. 1 shows an example of using the microcontroller 100 to control a three-phase synchronous motor. The microcontroller 100 has input terminals T0 through T5. The input terminals T0 through T2 are coupled to a synchronous motor 101 and are supplied with detection signals for motor currents corresponding to respective phases. The input terminal T3 and T4 are coupled to temperature sensors 102 and 103, respectively, and are supplied with detection signals from the temperature sensors 102 and 103. The temperature sensors 102 and 103 detect the temperature of a switching element provided for an inverter circuit or detect the temperature of an armature winding wire for the synchronous motor, for example. The input terminal T5 is coupled to a fan motor 104 and is supplied with a detection value as the drive voltage for the fan motor 104. Detection signals for motor currents supplied to the input terminals T0 through T2 are used for feedback control of the synchronous motor and need to be processed faster than detection signals for the temperature sensors or a detection signal for the fan motor 104 as a motor voltage.

As shown in FIG. 1, the microcontroller (semiconductor device) 100 includes a CPU 1, a conversion portion 2, peripheral circuits IP0, IP1, and IP2, an interrupt control circuit 3, a DMA control circuit 4, and a common bus 5. The CPU 1, the conversion portion 2, the peripheral circuits IP0, IP1, and IP2, and the DMA control circuit 4 are coupled to each other through the common bus 5.

The CPU 1 operates in accordance with a program stored in a memory circuit (not shown) and controls the entire operation of the microcontroller 100.

The conversion portion 2 includes plural input channels CH0 through CH5 (also generically referred to as an input channel CH) and A/D converts an input signal supplied to the one selected input channel in accordance with a request from the CPU 1 or the peripheral circuits IP0 through IP2. The conversion portion 2 uses a scan conversion mode as an operation mode to sequentially select the input channels CH0 and CH5 in this order and successively A/D convert input signals corresponding to all the channels.

According to the first embodiment, the input channels CH0 through CH2 are supplied with detection signals that require relatively fast processing for motor currents corresponding to the phases. The input channels CH3 and CH4 are supplied with detection signals from the temperature sensors 102 and 103. The input channel CH5 is supplied with a detection signal from the fan motor 104 as a motor voltage.

The conversion portion 2 includes a channel selection portion 11, an A/D converter 12, and a register group 13. The channel selection portion 11 selects one of signals supplied to the input channels CH0 through CH5 in accordance with a selection signal SEL received from the A/D converter 12 and outputs the selected signal. The first embodiment assumes the selection signal SEL to be a 6-bit signal whose bit signals correspond to the input channels CH of the conversion portion 2. Each input channel CH is selected if the corresponding bit signal goes to the H level.

The A/D converter 12 generates the selection signal SEL and A/D converts a signal that is output from the channel selection portion 11 in response to the selection signal SEL. The register group 13 includes data registers RA0 through RA5 (also generically referred to as a data register RA) corresponding to the input channels CH0 through CH5. Each data register RA stores an A/D conversion result for a signal input to the corresponding input channel CH.

The peripheral circuit IP0 processes signals using an A/D conversion result of a detection signal for motor currents supplied to the input channels CH0 through CH2. The peripheral circuit IP0 is coupled to the data registers RA0 through RA2 corresponding to the input channels CH0 through CH2 through a dedicated line and is capable of reading A/D conversion results stored in the data registers RA0 through RA2 without using the CPU 1.

The peripheral circuit IP0 is supplied with some bit signals out of the selection signal SEL generated from the A/D converter 12. As will be described in FIG. 2, the selection signal SEL notifies completion of the A/D conversion. Using the selection signal SEL, the peripheral circuit IP0 can acknowledge completion of A/D conversion of input signals supplied to the input channels CH0 through CH2 before the conversion portion 2 performs scan conversion and completes A/D conversion of all input signals.

The peripheral circuit IP1 performs signal processing using A/D conversion results of detection signals supplied to the input channels CH3 and CH4 from the temperature sensors 102 and 103. As shown in FIG. 1, the peripheral circuit IP1 is coupled to the data registers RA3 and RA4 through a dedicated line and is capable of reading A/D conversion results stored in the data registers RA3 and RA4 without using the CPU 1. This coupling method of using the dedicated line necessitates an area for wiring the dedicated line. On the other hand, high-speed processing is unnecessary for detection signals from the temperature sensors 102 and 103. It may be preferable to transfer A/D conversion results stored in the data registers RA3 and RA4 to the peripheral circuit IP1 through the common bus 5 and the CPU 1 without using the dedicated line.

The peripheral circuit IP2 performs signal processing using a detection signal supplied to the input channel CH5 as a motor voltage of the fan motor 104. As shown in FIG. 1, the peripheral circuit IP2 is coupled to the data register RA5 through a dedicated line and is capable of reading A/D conversion results stored in the data register RA5 without using the CPU 1. Similarly to the peripheral circuit IP1, high-speed processing is unnecessary for detection signals as motor voltages of the fan motor 104. It may be preferable to transfer A/D conversion results stored in the data register RA5 to the peripheral circuit IP2 through the common bus 5 and the CPU 1 without using the dedicated line.

The interrupt control circuit 3 controls an interrupt operation that interrupts active processing in the CPU 1 and performs more highly prioritized processing. The interrupt control circuit 3 notifies the CPU 1 of an interrupt occurrence in response to an interrupt request issued from the conversion portion 2 or the peripheral circuit. If the conversion portion 2 performs scan conversion and completes the A/D conversion of all input signals, the interrupt control circuit 3 receives a completion notification signal CMP notifying completion of the A/D conversion from the conversion portion 2 and outputs an interrupt signal to the CPU 1.

The DMA control circuit 4 controls DMA (Direct Memory Access) transfer that transfers data without the CPU 1. The CPU 1 might receive an interrupt control signal from the interrupt control circuit 3 after completion of the scan conversion. In this case, the CPU 1 instructs the DMA control circuit 4 to transfer A/D conversion results to the peripheral circuits IP1 and IP2. The peripheral circuits IP1 and IP2 receive a control signal from the DMA control circuit 4 and acknowledge completion of the A/D conversion. The A/D conversion results stored in the data registers RA3 and RA4 are transferred to the peripheral circuit IP1 through the dedicated line. An A/D conversion result stored in the data register RA5 is transferred to the peripheral circuit IP2 through the dedicated line.

Figure 2:
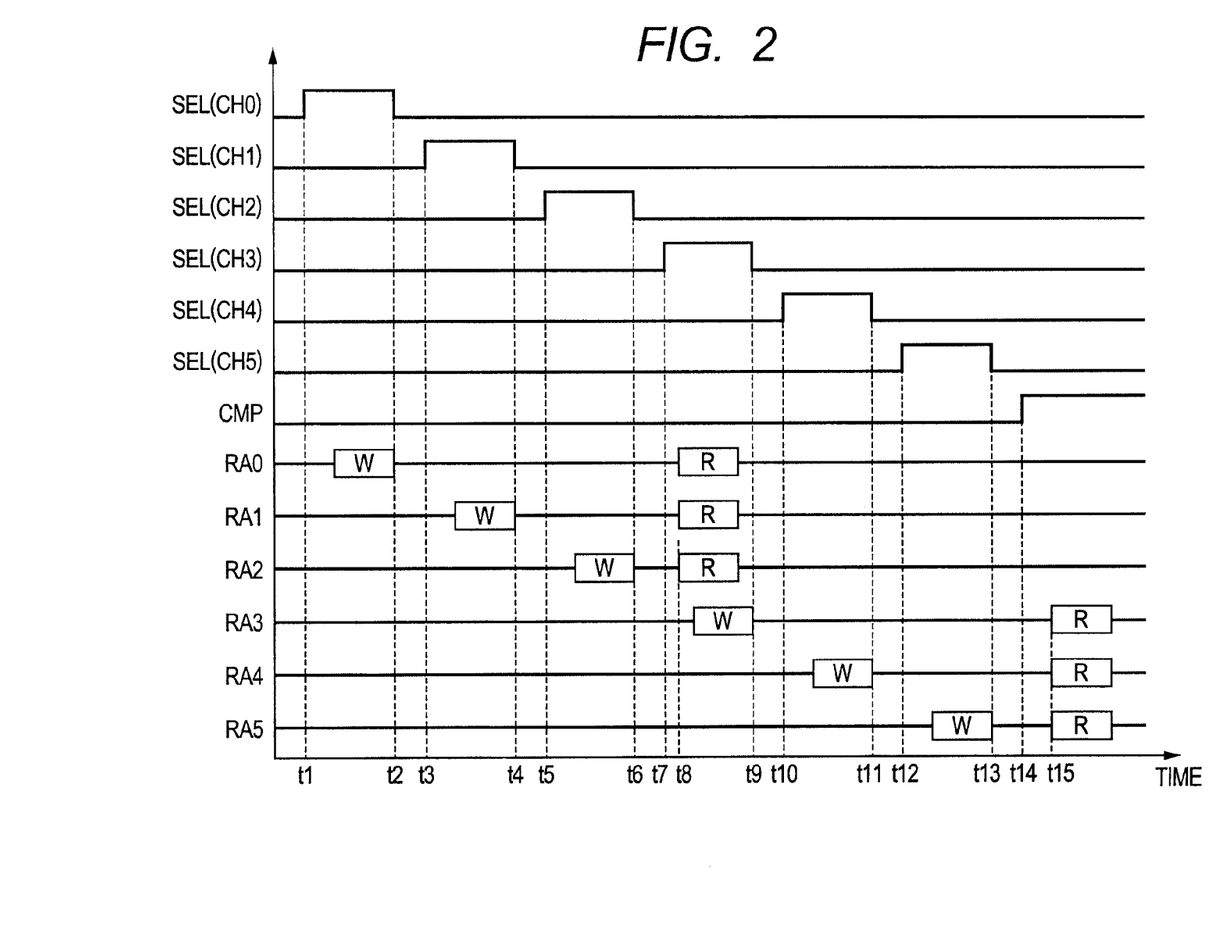
FIG. 2 is a timing chart showing operations of the microcontroller 100 in FIG. 1.

FIG. 2 is a timing chart showing operations of the microcontroller 100 in FIG. 1. FIG. 2 shows operations of the conversion portion 2 in FIG. 1 when it receives a scan conversion instruction from the CPU 1 or any of the peripheral circuits IP0 through IP2. FIG. 2 shows, from the top to the bottom, bit waveforms of the selection signal SEL for selecting the input channels CH0 through CH5, a waveform of the completion notification signal CMP, and operations (writing (W) or reading (R)) of the data registers RA0 through RA5.

With reference to FIGS. 1 and 2, the input channel CH0 is selected from time t1 to time t2 and an A/D conversion result of the signal input to the input channel CH0 is written to the data register RA0. The input channel CH1 is selected from time t3 to time t4 and an A/D conversion result of the signal input to the input channel CH1 is written to the data register RA1. The input channel CH2 is selected from time t5 to time t6 and an A/D conversion result of the signal input to the input channel CH2 is written to the data register RA2. The input channel CH3 is selected from time t7 to time t9 and an A/D conversion result of the signal input to the input channel CH3 is written to the data register RA3. The input channel CH4 is selected from time t10 to time t11 and an A/D conversion result of the signal input to the input channel CH4 is written to the data register RA4. The input channel CH5 is selected from time t12 to time t13 and an A/D conversion result of the signal input to the input channel CH5 is written to the data register RA5.

The peripheral circuit IP0 receives a bit signal SEL (CH3) for selecting the input channel CH3 out of the selection signal SEL from the A/D converter 12. The input channel CH3 is configured to be selected next to the input channel CH2 out of the input channels CH0 through CH2 related to the peripheral circuit IP0. The peripheral circuit IP0 detects the timing to set the input channel CH3 to the H level at time t7, that is, the timing to start selecting the input channel CH3, from the bit signal SEL (CH3). This signifies that the peripheral circuit IP0 is notified of completion of the A/D conversion for signals input to the input channels CH0 through CH2 from the conversion portion 2.

At time t8 after receiving the notification of completion of the A/D conversion, the peripheral circuit IP0 starts reading A/D conversion results stored in the data registers RA0 through RA2.

At time t14 after completion of the A/D conversion for input signals supplied to all the input channels, the A/D converter 12 outputs the completion notification signal CMP indicating completion of the A/D conversion to the interrupt control circuit 3. The CPU 1 receives the interrupt control signal from the interrupt control circuit 3 and instructs the DMA control circuit 4 to transfer A/D conversion results. At time t15, the DMA control circuit 4 starts transferring A/D conversion results from the data register RA3 through RA5 to the peripheral circuits IP1 and IP2.

As mentioned above, the microcontroller 100 according to the first embodiment uses the selection signal SEL to notify the peripheral circuit IP0 of completion of the A/D conversion. Accordingly, the peripheral circuit IP0 can read an A/D conversion result before completion of the A/D conversion for input signals supplied to all the input channels. The method of using the selection signal SEL for the completion notification is available if the peripheral circuit IP0 is provided with an interface portion for receiving the selection signal SEL. The circuit area increases less than the related art.

In the selection signal SEL, the bit signal SEL (CH2) for selecting the input channel CH2 may be used to notify the peripheral circuit IP0 of completion of the A/D conversion. In this case, the peripheral circuit IP0 acknowledges completion of the A/D conversion by detecting that the bit signal SEL (CH2) for selecting the input channel CH2 changes to the L level (to finish selecting the input channel CH2).

The embodiment notifies the peripheral circuit IP0 of completion of the A/D conversion on a signal input to the input channel CH2. In addition, the peripheral circuit IP0 may be notified of completion of the A/D conversion on signals input to the input channels CH0 and CH1. In this case, the peripheral circuit IP0 can read the A/D conversion results from the data registers RA0 and RA1 immediately after completion of the A/D conversion on signals input to the input channels CH0 and CH1.

Modification of the First Embodiment

Figure 3:
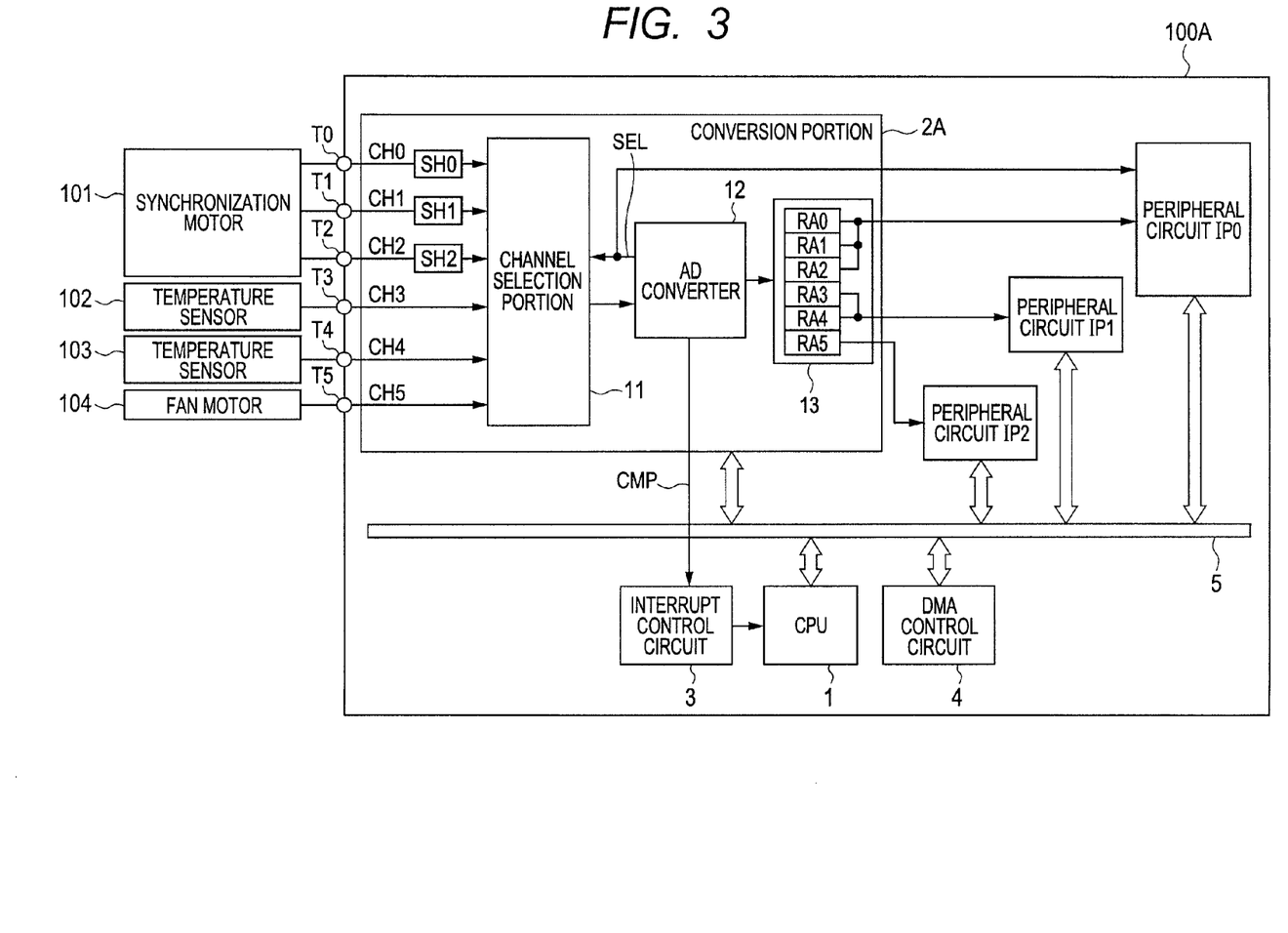
FIG. 3 is a block diagram showing a configuration of a microcontroller 100A according to a modification of the first embodiment of the invention.

FIG. 3 is a block diagram showing a configuration of a microcontroller 100A according to a modification of the first embodiment of the invention. A conversion portion 2A shown in FIG. 3 differs from the conversion portion 2 shown in FIG. 1 in that the input channels CH0 through CH2 include corresponding sample hold circuits SH0 through SH2 (generically referred to as a sample hold circuit SH). The other points in FIG. 3 are equal to those shown in FIG. 1. Therefore, the same or equivalent parts are depicted by the same reference numerals and a description is omitted for simplicity.

The sample hold circuit SH samples and holds a signal supplied to the corresponding input channel CH. Signals incorporated into the sample hold circuits SH0 through SH2 are used to A/D convert signals supplied to the input channels CH0 through CH2.

There may be a case where an input signal to the input channels CH0 through CH2 temporally changes faster than the time required for the A/D conversion. In such a case, a detection error increases if the sample hold circuit SH is not provided. As shown in FIG. 3, provision of the sample hold circuit SH can perform the A/D conversion on signals sampled at the same timing.

Figure 4:
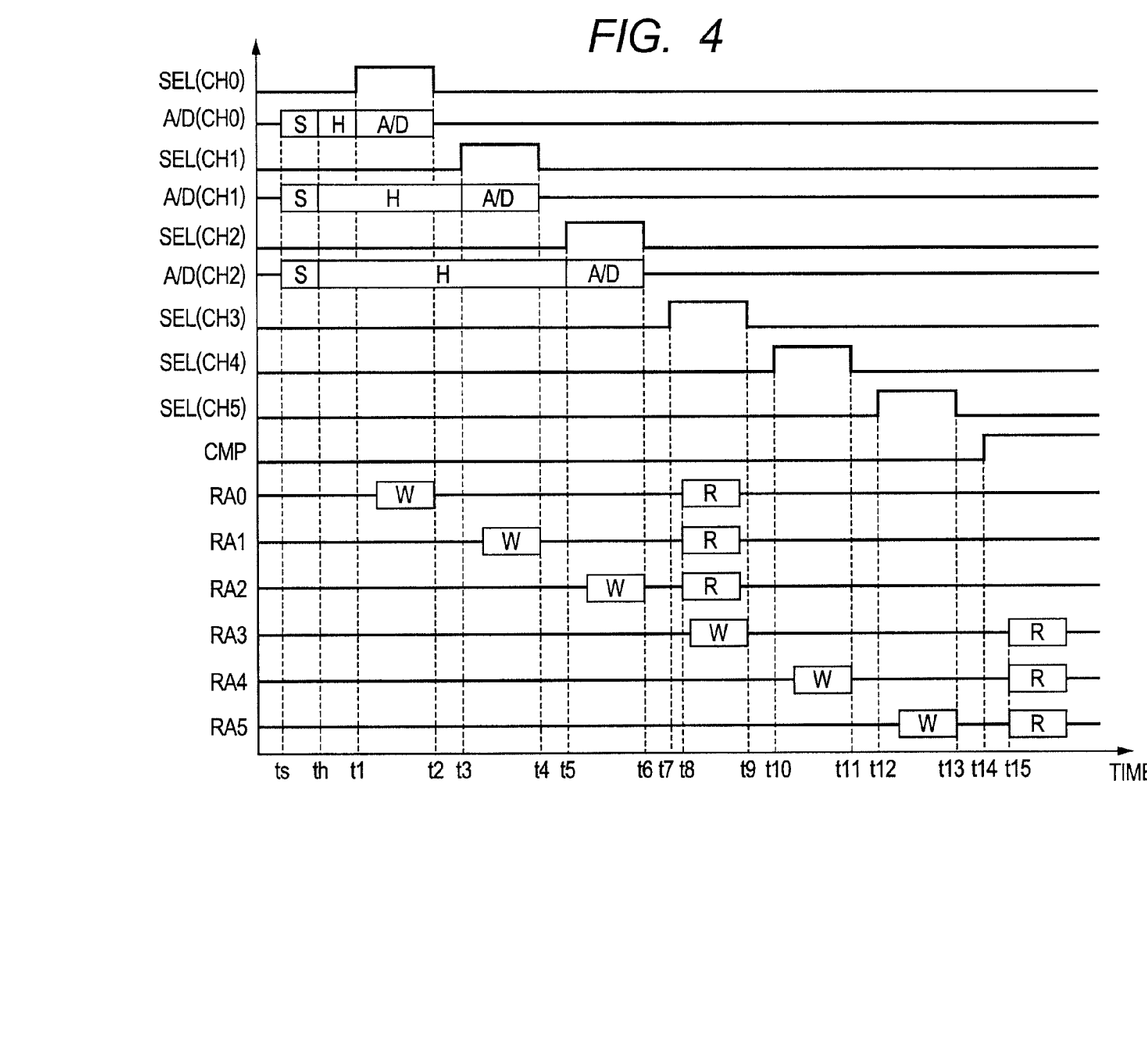
FIG. 4 is a timing chart showing operations of the microcontroller 100A in FIG. 3.

FIG. 4 is a timing chart showing operations of the microcontroller 100A in FIG. 3. FIG. 4 shows operations of the conversion portion 2A when it receives a scan conversion instruction from the CPU 1 or from any one of the peripheral circuits IP0 through IP2. FIG. 4 shows, from the top to the bottom, a waveform (SEL (CH0)) of the bit signal in the selection signal for selecting the input channel CH0, an operation (A/D (CH0)) of the conversion portion 2A corresponding to an input signal to the input channel CH0, a waveform (SEL (CH1)) of the bit signal in the selection signal for selecting the input channel CH1, an operation (A/D (CH1)) of the conversion portion 2A corresponding to an input signal to the input channel CH1, a waveform (SEL (CH2)) of the bit signal in the selection signal for selecting the input channel CH2, and an operation (A/D (CH2)) of the conversion portion 2A corresponding to an input signal to the input channel CH2. FIG. 4 further shows waveforms of the bit signals in the selection signal SEL for selecting the input channels CH3 through CH5, a waveform of the completion notification signal CMP, and operations (writing (W) or reading (R)) of the data registers RA0 through RA5.

With reference to FIGS. 3 and 4, the conversion portion 2A starts sampling signals input to the input channels CH0 through CH2 at time ts. At the next time th, the conversion portion 2A finishes sampling the signals input to the input channels CH0 through CH2 and holds the sampled signals. The conversion portion 2A A/D converts the input signal held in the sample hold circuit SH0 between time t1 and time t2. The conversion portion 2A A/D converts the input signal held in the sample hold circuit SH1 between time t3 and time t4. The conversion portion 2A A/D converts the input signal held in the sample hold circuit SH2 between time t5 and time t6. The other points in FIG. 4 are equal to those shown in FIG. 2. Therefore, the same or equivalent parts are depicted by the same reference numerals and a description is omitted for simplicity.

Second Embodiment

Figure 5:
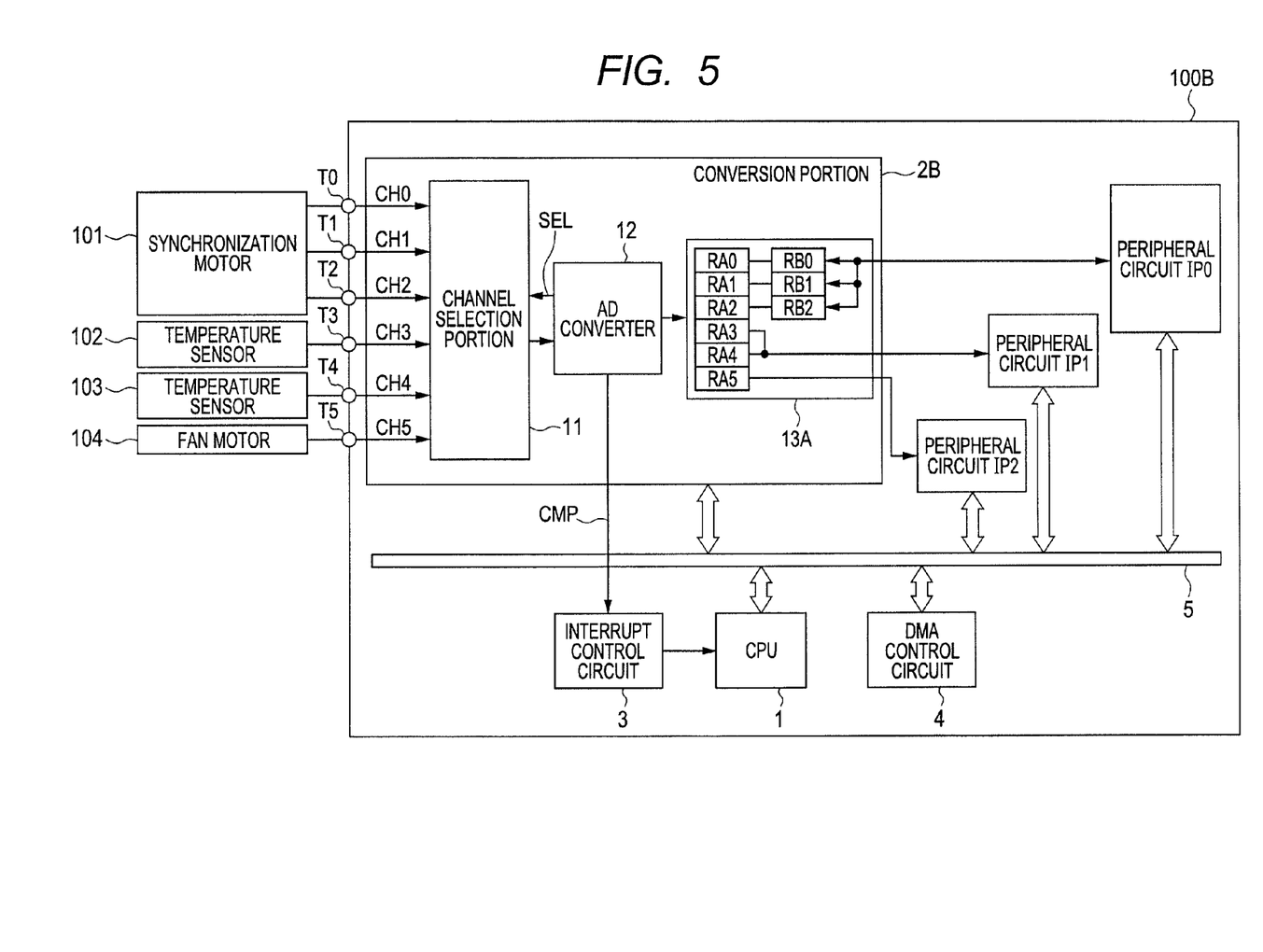
FIG. 5 is a block diagram showing a configuration of a microcontroller 100B according to a second embodiment of the invention.

FIG. 5 is a block diagram showing a configuration of a microcontroller 100B according to a second embodiment of the invention.

The microcontroller 100B in FIG. 5 differs from the microcontroller 100 in FIG. 1 in that the register group 13A in the conversion portion 2B further includes flag registers RB0 through RB2 (also generically referred to as a flag register RB) corresponding to the input channels CH0 through CH2. In addition, the microcontroller 100B in FIG. 5 differs from the microcontroller in FIG. 1 in that part of the selection signal SEL is not output to the peripheral circuit IP0. The other points in FIG. 5 are equal to those shown in FIG. 1. Therefore, the same or equivalent parts are depicted by the same reference numerals and a description is omitted for simplicity.

The peripheral circuit IP0 can read and write the contents in the flag register RB through a dedicated line. The A/D converter 12 finishes A/D converting a signal input to any of the input channels CH0 through CH2 and rewrites the corresponding flag register RB to "1" that represents completion of the A/D conversion. The A/D converter 12 thereby notifies the peripheral circuit IP0 of completion of the A/D conversion. The peripheral circuit IP0 reads an A/D conversion result stored in any of the data registers RA0 through RA2 and writes the flag register RB corresponding to the data register RA back to "0" that represents incompletion of the A/D conversion. The peripheral circuit IP0 thereby notifies the conversion portion 2B of completion of data reading.

Figure 6:
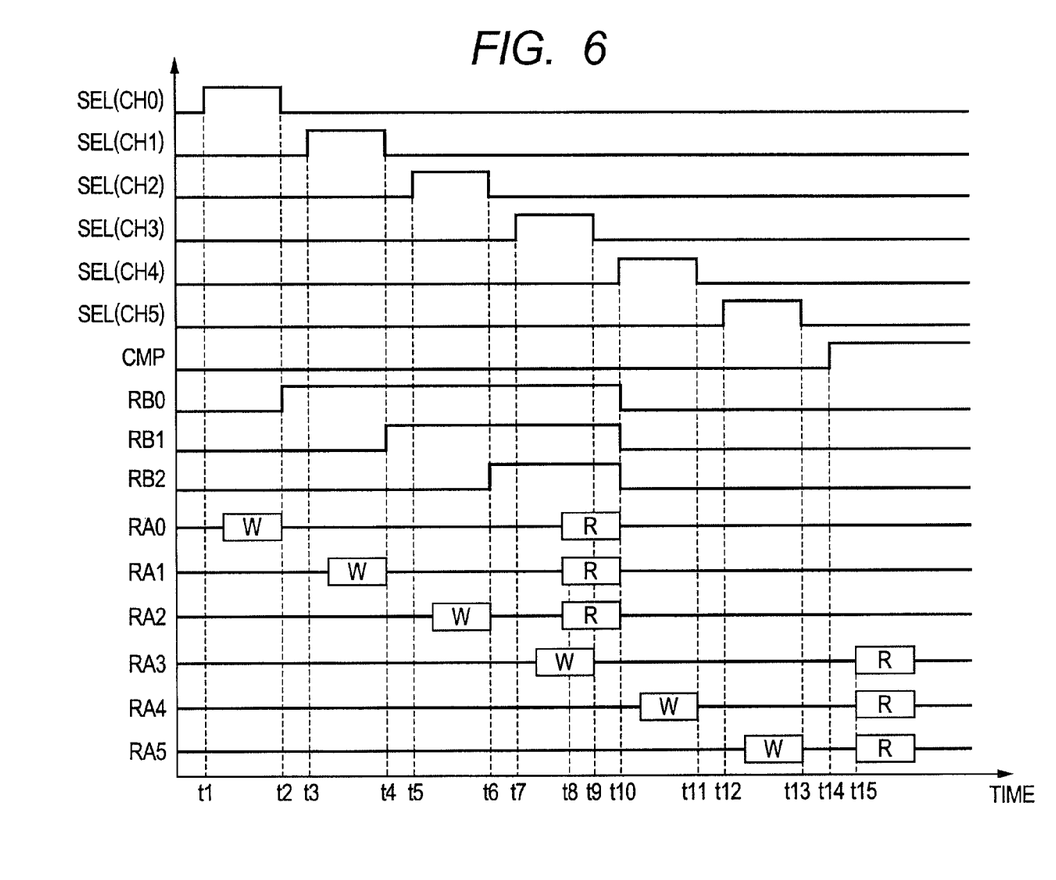
FIG. 6 is a timing chart showing operations of the microcontroller 100B in FIG. 5.

FIG. 6 is a timing chart showing operations of the microcontroller 100B in FIG. 5. FIG. 6 shows operations when the conversion portion 2B in FIG. 5 receives a scan conversion instruction from the CPU 1 or any of the peripheral circuits IP0 through IP2. FIG. 6 shows, from the top to the bottom, bit waveforms in the selection signal SEL for selecting the input channels CH0 through CH5, a waveform of the completion notification signal CMP, states (high level "1" and low level "0") of the flag registers RB0 through RB2, and operations (writing (W) or reading (R)) of the data registers RA0 through RA5.

With reference to FIGS. 5 and 6, the conversion portion 2B selects the input channel CH0 from time t1 to time t2 and writes an A/D conversion result of the signal input to the input channel CH0 into the data register RA0. At time t2, the A/D converter 12 rewrites the flag register RB0 to "1" in order to notify the peripheral circuit IP0 of completion of the A/D conversion on the signal input to the input channel CH0.

From time t3 to time t4, the conversion portion 2B selects the input channel CH1 and writes an A/D conversion result of the signal input to the input channel CH1 into the data register RA1. At time t4, the A/D converter 12 rewrites the flag register RB1 to "1" in order to notify the peripheral circuit IP0 of completion of the A/D conversion on the signal input to the input channel CH1.

From time t5 to time t6, the conversion portion 2B selects the input channel CH2 and writes an A/D conversion result of the signal input to the input channel CH2 into the data register RA2. At time t6, the A/D converter 12 rewrites the flag register RB2 to "1" in order to notify the peripheral circuit IP0 of completion of the A/D conversion on the signal input to the input channel CH2.

From time t7 to time t9, the conversion portion 2B selects the input channel CH3 and writes an A/D conversion result of the signal input to the input channel CH3 into the data register RA3. From time t10 to time t11, the conversion portion 2B selects the input channel CH4 and writes an A/D conversion result of the signal input to the input channel CH4 into the data register RA4. From time t12 to time t13, the conversion portion 2B selects the input channel CH5 and writes an A/D conversion result of the signal input to the input channel CH5 into the data register RA5.

The peripheral circuit IP0 reads data "1" from the flag registers RB0 through RB2 and thereby acknowledges completion of the A/D conversion on the signals input to the input channels CH0 through CH2. In response to the result read from the flag register RB, the peripheral circuit IP0 reads A/D conversion results stored in the data registers RA0 through RA2 from time t8 to time t10. Upon completion of reading the A/D conversion results at time t10, the peripheral circuit IP0 writes "0" into the flag registers RB0 through RB2 in order to notify the A/D converter of completion of the reading.

At time t14 after completion of the A/D conversion on the input signals input to all the input channels, the A/D converter 12 outputs the completion notification signal CMP indicating completion of the A/D conversion to the interrupt control circuit 3. The CPU 1 receives an interrupt control signal from the interrupt control circuit 3 and instructs the DMA control circuit 4 to transfer A/D conversion results. At the next time t15, the DMA control circuit 4 starts transferring the A/D conversion results from the data registers RA3 through RA5 to the peripheral circuits IP1 and IP2.

As mentioned above, the microcontroller 100B according to the second embodiment can acknowledge completion of the A/D conversion upon completion of the A/D conversion on signals input to the input channels CH0 through CH2. The timing to read A/D conversion results can be specified earlier than the related art.

According to the second embodiment, the A/D converter 12 can confirm that the peripheral circuit IP0 reads A/D conversion results when the flag registers RB0 through RB2 are written back to "0." It is possible to prevent data from being overwritten before the peripheral circuit IP0 reads an A/D conversion result. The first embodiment leaves the possibility of overwriting because the A/D converter 12 does not confirm whether the peripheral circuit IP0 reads an A/D conversion result. The second embodiment improves this issue.

Similarly to the modification of the first embodiment, the microcontroller 100B according to the second embodiment can be provided with the sample hold circuits SH0 through SH2.

Third Embodiment

Figure 7:
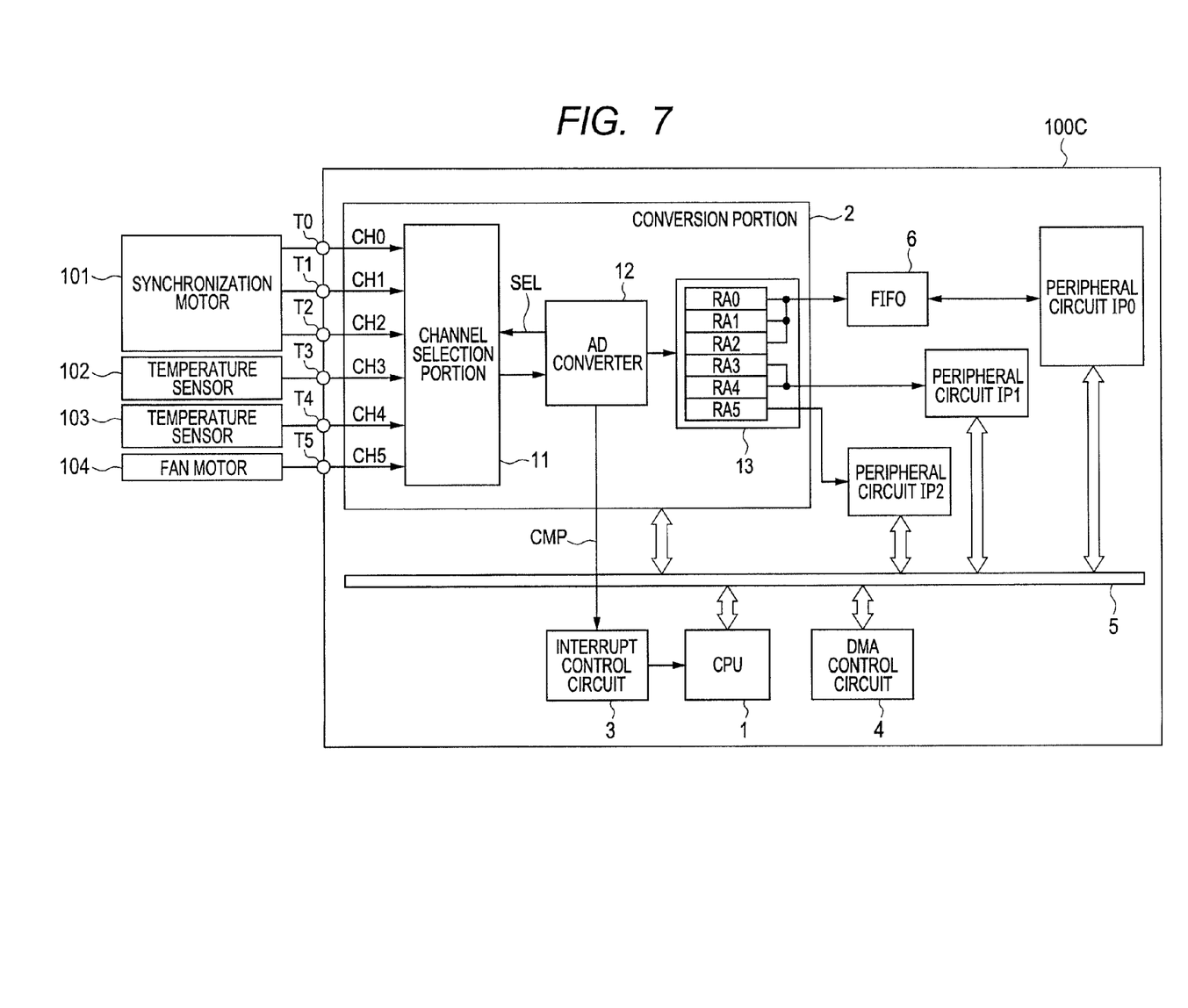
FIG. 7 is a block diagram showing a configuration of a microcontroller 100C according to a third embodiment of the invention.

FIG. 7 is a block diagram showing a configuration of a microcontroller 100C according to a third embodiment of the invention.

The microcontroller 100C in FIG. 7 differs from the microcontroller 100 in FIG. 1 in that FIFO (First-In First-Out) buffer memory 6 is further included. In addition, the microcontroller 100C in FIG. 7 differs from the microcontroller 100 in FIG. 1 in that part of the selection signal SEL is not output to the peripheral circuit IP0. The other points in FIG. 7 are equal to those shown in FIG. 1. Therefore, the same or equivalent parts are depicted by the same reference numerals and a description is omitted for simplicity.

The peripheral circuit IP0 can read data from the buffer memory 6 through a dedicated line. The buffer memory 6 has such storage capacity as being capable of storing plural A/D conversion results for the input channels CH0 through CH2. Similarly to the normal FIFO, the buffer memory 6 includes an empty flag (EF) set to "1" if the memory is empty, a full flag (FF) set to "1" if the memory is full, and a write pointer and a read pointer indicating positions for writing and reading.

The A/D converter 12 notifies the peripheral circuit IP0 of completion of the A/D conversion by writing A/D conversion results of signals input to the input channels CH0 through CH2 onto the data registers RA0 through R2 and the buffer memory 6. The peripheral circuit IP0 detects completion of the A/D conversion by detecting the empty flag set to "0."

Figure 8:
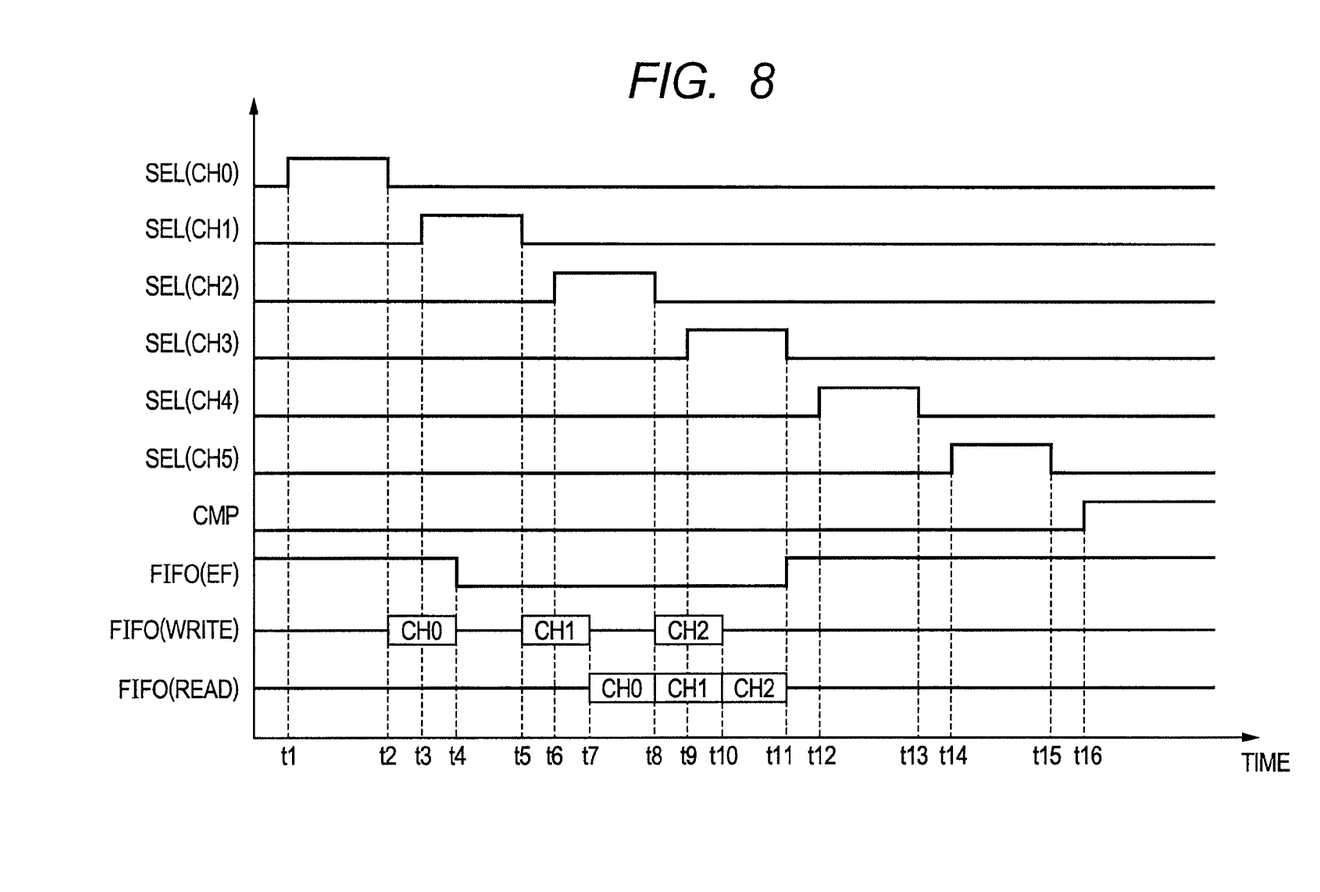
FIG. 8 is a timing chart showing operations of the microcontroller 100C in FIG. 7.

FIG. 8 is a timing chart showing operations of the microcontroller 100C in FIG. 7. FIG. 8 shows operations when the conversion portion 2 receives a scan conversion instruction from the CPU 1 or any of the peripheral circuits IP0 through IP2. FIG. 8 shows, from the top to the bottom, bit waveforms in the selection signal SEL for selecting the input channels CH0 through CH5, a waveform of the completion notification signal CMP, states (high level "1" and low level "0") of the empty flag provided for the buffer memory 6, contents of data written to the buffer memory 6, and contents of data read from the buffer memory 6.

With reference to FIGS. 7 and 8, the conversion portion 2 selects the input channel CH0 from time t1 to time t2 and writes an A/D conversion result of the signal input to the input channel CH0 into the data register RA0. The conversion portion 2 writes an A/D conversion result of the signal input to the input channel CH0 into the buffer memory 6 between time t2 and time t4 after completion of the A/D conversion. The empty flag provided for the buffer memory 6 changes from "1" to "0" when writing to the buffer memory 6 finishes at time t4.

The conversion portion 2 selects input channel CH1 from time t3 to time t5 and writes the A/D conversion result of a signal input to the input channel CH1 into the data register RA1. The conversion portion 2 writes an A/D conversion result of the signal input to the input channel CH1 into the buffer memory 6 between time t5 and time t7 after completion of the A/D conversion.

The conversion portion 2 selects input channel CH2 from time t6 to time t8 and writes the A/D conversion result of a signal input to the input channel CH2 into the data register RA2. The conversion portion 2 writes an A/D conversion result of the signal input to the input channel CH2 into the buffer memory 6 between time t8 and time t10 after completion of the A/D conversion.

From time t9 to time t11, the conversion portion 2 selects the input channel CH3 and writes an A/D conversion result of the signal input to the input channel CH3 into the data register RA3. From time t12 to time t13, the conversion portion 2 selects the input channel CH4 and writes an A/D conversion result of the signal input to the input channel CH4 into the data register RA4. From time t14 to time t15, the conversion portion 2 selects the input channel CH5 and writes an A/D conversion result of the signal input to the input channel CH5 into the data register RA5.

The peripheral circuit IP0 periodically checks the empty flag and detects it set to "0" to acknowledge completion of the A/D conversion on a signal input to any of the input channels CH0 through CH2. In response to the detection result from the empty flag, the peripheral circuit IP0 sequentially reads A/D conversion results stored in the data registers RA0 through RA2 between time t7 and time 11. The peripheral circuit IP0 finishes reading A/D conversion results at time t11. At this point, the empty flag provided for the buffer memory 6 is configured to return to "1" from "0." Alternatively, the peripheral circuit IP0 reconfigures the empty flag like this.

At time t16 after completion of the A/D conversion on input signals to all the input channels, the A/D converter 12 outputs the completion notification signal CMP indicating completion of the A/D conversion to the interrupt control circuit 3. The CPU 1 receives an interrupt control signal from the interrupt control circuit 3 and instructs the DMA control circuit 4 to transfer A/D conversion results. The DMA control circuit 4 starts transferring the A/D conversion results from the data registers RA3 through RA5 to the peripheral circuits IP1 and IP2.

As mentioned above, the microcontroller 100C according to the third embodiment is provided with the FIFO buffer memory 6. For this reason, the peripheral circuit IP0 can acknowledge completion of the A/D conversion when results of A/D conversion on signals input to the input channels CH0 through CH2 are written into the buffer memory 6. The timing to read A/D conversion results can be specified earlier than the related art.

The microcontroller 100B according to the second embodiment is configured so that the A/D converter 12 confirms the contents of the flag registers RB0 through RB2. Accordingly, the A/D conversion might stop if the peripheral circuit IP0 delays data processing for some reason. On the other hand, the microcontroller 100C according to the third embodiment can write A/D conversion results until the buffer memory 6 becomes full. The microcontroller 100C reduces the possibility of a delay in the A/D conversion even if the peripheral circuit IP0 delays data processing for some reason.

The third embodiment has described the example of the FIFO buffer memory 6 but is not limited thereto. The memory may be based on the addressing system. The memory may replace the above-mentioned buffer memory 6 if the peripheral circuit IP0 can detect A/D conversion results written into the memory using a flag register without using the CPU 1 and can read data written into the memory through a dedicated line without using the CPU 1.

Similarly to the modification of the first embodiment, the microcontroller 100C according to the third embodiment can be provided with the sample hold circuits SH0 through SH2.

All the disclosed embodiments just provide examples and must be considered to be nonrestrictive. The scope of the invention is defined by the appended claims, not the above description, and is intended to include meanings equivalent to the claims and all modifications within the claims.

What is claimed is:

1. A semiconductor device comprising:
a central processing unit;
a plurality of peripheral circuits including first and second peripheral circuits;
and a conversion portion that has a plurality of input channels including one or more first channels and one or more second channels, a channel selection portion for selecting one of the input channels, and analog-to-digital (A/D) converter for converting a signal input from a selected input channel and outputting a selection signal to the channel selection portion and a completion signal,
wherein signal processing in the first peripheral circuit uses an A/D conversion result on a signal input from the one or more first channels, wherein signal processing in the second peripheral circuit uses an A/D conversion result on a signal input from the one or more second channels, wherein the conversion portion receives a scan conversion instruction from the central processing unit, sequentially selects a respective one of the input channels in accordance with a selection signal from the channel selection portion based on a specified selection order, and successively performs A/D conversion, and wherein when the conversion portion performs a scan conversion in response to the scan conversion instruction, the first peripheral circuit receives a conversion result of the one or more first channels in response to the selection signal identified completion of A/D conversion and the second peripheral circuit receives a conversion result of the one or more second channels in response to the selection signal identified completion of A/D conversion for all input channels.

2. The semiconductor device according to claim 1, wherein the conversion portion notifies the first peripheral circuit of completion of A/D conversion on a signal input to the one or more first channels without using the central processing unit.

3. The semiconductor device according to claim 2, wherein the conversion portion further includes a plurality of data registers associated with the input channels, wherein each of the data registers stores an A/D conversion result of a signal input to a corresponding input channel, and wherein the first peripheral circuit is capable of reading, without using the central processing unit, A/D conversion results stored in data registers corresponding to the one or more first channels.

4. The semiconductor device according to claim 2, wherein the conversion portion includes:
    a plurality of data registers that are provided corresponding to the input channels and each store an A/D conversion result of a signal input from the selected input channel; and one or more flag registers corresponding to the one or more first channels, wherein the first peripheral circuit is capable of reading contents of the one or more flag registers without using the central processing unit, and wherein the A/D converter finishes A/D converting signals input to the one or more first channels, sets a corresponding flag register to a value indicating completion of A/D conversion, and thereby notifies the first peripheral circuit of completion of A/D conversion.

5. The semiconductor device according to claim 4, wherein the first peripheral circuit is capable of reading, without using the central processing unit, A/D conversion results stored in one or more data registers corresponding to the one or more first channels, and wherein the first peripheral circuit reads an A/D conversion result stored in a data register corresponding to each of the one or more first channels and sets a corresponding flag register to a value indicating incompletion of A/D conversion.

6. The semiconductor device according to claim 2, further comprising:
    buffer memory, wherein the first peripheral circuit is capable of reading, without using the central processing unit, data stored in the buffer memory and is capable of detecting whether the buffer memory stores data, and wherein the conversion portion writes an A/D conversion result of a signal input to each of the one or more first channels into the buffer memory and thereby notifies the first peripheral circuit of completion of A/D conversion.

7. The semiconductor device according to claim 2, wherein the conversion portion includes one or more sample hold circuits for incorporating a signal input to each of the one or more first channels, and wherein the conversion portion A/D converts a signal incorporated into a sample hold circuit corresponding to each of the one or more first channels.

8. The semiconductor device according to claim 2, further comprising:
    an interrupt control circuit that outputs an interrupt signal to the central processing unit in response to A/D conversion completion notification received from the conversion portion when the conversion portion receives the scan conversion instruction and finishes A/D converting input signals input to all input channels.

9. A motor controlling system comprising:
    a motor;
    a temperature sensor;
    and a semiconductor device, which comprises a plurality of terminals, an analog-to-digital (A/D) conversion unit comprising a selection unit for selecting one terminal of the plurality of terminals to perform an A/D conversion operation, a plurality of function units, and first plural terminals used for coupling with the motor, and a second terminal used for coupling with the temperature sensor,
    wherein the A/D conversion unit converts a signal input from a selected input channel and outputs a selection signal to the selection unit and a completion signal,
    wherein a first function unit of the plurality of function units is a central processing unit for controlling the semiconductor device thereof, wherein a second function unit of the plurality of function units is a data processing unit for a conversion result of the motor, wherein a third function unit of the plurality of function units is a data processing unit for a conversion result of the temperature sensor,
    wherein in response to receiving a first A/D conversion instruction from the central processing unit, the A/D conversion unit performs the A/D conversion operation for a signal received from respective terminals continuously without an intervening instruction for specifying the terminal from the central processing unit, wherein the second function unit starts a data processing in response to completion of the A/D conversion operation for the first plural terminals without an instruction from the central processing unit, and wherein the third function unit starts a data processing in response to a notification from the central processing unit regarding with a completion of the A/D conversion operation in accordance with the first A/D conversion instruction.

10. The motor controlling system according to claim 9, wherein the second function unit starts the data processing in response that the selection unit selects the second terminal after selecting the first plural terminals in the A/D conversion operation.

11. The motor controlling system according to claim 10, wherein a number of the first plural terminals is three, and the motor is three-phase synchronous motor.

* * * * *

UNITED STATES PATENT AND TRADEMARK OFFICE
CERTIFICATE OF CORRECTION

| | | |
|---|---|---|
| PATENT NO. | : 9,094,037 B2 | Page 1 of 1 |
| APPLICATION NO. | : 13/331923 | |
| DATED | : July 28, 2015 | |
| INVENTOR(S) | : Daijiro Harada and Takashi Utsumi | |

It is certified that error appears in the above-identified patent and that said Letters Patent is hereby corrected as shown below:

In the claims,

Column 10, Line 54: In Claim 1, delete "conversion" and insert -- conversion for the one or more first channels, --

Signed and Sealed this
Twelfth Day of January, 2016

Michelle K. Lee
*Director of the United States Patent and Trademark Office*